(12) United States Patent
Ramsey

(10) Patent No.: US 7,914,313 B1
(45) Date of Patent: Mar. 29, 2011

(54) CLAMPING MECHANISM FOR AN IC SOCKET

(75) Inventor: James M. Ramsey, Frisco, TX (US)

(73) Assignee: Plastronics Socket Partners, Ltd., Irving, TX (US)

(*) Notice: Subject to any disclaimer, the term of this patent is extended or adjusted under 35 U.S.C. 154(b) by 0 days.

(21) Appl. No.: 12/700,610

(22) Filed: Feb. 4, 2010

(51) Int. Cl.
*H01R 13/62* (2006.01)
(52) U.S. Cl. .......................................... 439/330; 439/71
(58) Field of Classification Search .................. 439/330, 439/331, 68–73, 487, 266, 268, 259, 263–265; 361/820
See application file for complete search history.

(56) References Cited

U.S. PATENT DOCUMENTS

| | | | |
|---|---|---|---|
| 6,045,370 A | | 4/2000 | Treibergs et al. |
| 6,280,219 B1 * | | 8/2001 | Sano et al. ..................... 439/268 |
| 6,439,910 B2 * | | 8/2002 | Hayakawa ..................... 439/266 |
| 6,500,017 B2 * | | 12/2002 | Hayakawa ..................... 439/268 |
| 6,575,767 B2 * | | 6/2003 | Satoh et al. ..................... 439/71 |
| 7,030,638 B2 | | 4/2006 | Stutzman |
| 7,108,517 B2 | | 9/2006 | Harper |
| 7,482,825 B2 | | 1/2009 | Lopez et al. |
| 2001/0055902 A1 * | | 12/2001 | Hayakawa ..................... 439/259 |

* cited by examiner

*Primary Examiner* — Edwin A. Leon
(74) *Attorney, Agent, or Firm* — Mark W Handley

(57) ABSTRACT

A clamping mechanism (18) for an IC socket (14) is disclosed having two moveable arms (36) which are spaced apart on opposite sides of the IC socket (14), with first ends pivotally secured to a fixed shaft (34) at moveable arm pivot points for moving from a lifted position to a lowered position, extending across the IC socket (14). Two clamp arms (38) are spaced apart on opposite sides of the IC socket (14), and have formed ends (40) pivotally secured to the second ends (166) of the moveable arms (36) at latch pivot points. The clamp arms (38) are configured such that, when the moveable arms (36) are disposed in the lowered positions and the clamp arms (38) are disposed in the clamping positions, a hooking shaft (32) is disposed in the self-locking positions in openings (156) in the clamp arms (38) such that upward forces applied to the moveable arms (36) will engage the hooking shaft (32) against the clamp arms (38) and urge the clamp arms (38) into the latched position.

18 Claims, 7 Drawing Sheets

US 7,914,313 B1

CLAMPING MECHANISM FOR AN IC SOCKET

TECHNICAL FIELD OF THE INVENTION

The present invention relates in general to test sockets for IC components, and in particular to a clamping mechanism for securing IC components with the test sockets.

BACKGROUND OF THE INVENTION

Prior art test sockets have been provided for testing integrated circuit components "IC components." IC sockets have compliant contact pins which make electrical contact with an IC component by pressing against contact surfaces if the IC component which results in pushing the IC component outward from within the IC sockets. Clamping mechanisms have been provided for holding the IC components in IC sockets against the force of the compliant contact pins. Prior art clamping mechanism have been provided with both clamp arms for holding the IC components and a separate latch for locking the clamp arms in position.

SUMMARY OF THE INVENTION

A novel clamping mechanism for an IC socket is disclosed having a clamp arm which is self-latching for securing an IC component within the IC socket. The clamping mechanism has two moveable arms which are spaced apart on opposite sides of the socket, with first ends pivotally secured to a fixed shaft at moveable arm pivot points for moving from a lifted position to a lowered position, extending across the socket. Two clamp arms are spaced apart on opposite sides of the socket, and have formed ends pivotally secured to the second ends of the moveable arms at latch pivot points. The clamp arms are configured such that, when the moveable arms are disposed in the lowered positions and the clamp arms are disposed in the clamping positions, a hooking shaft is disposed in self-locking positions in openings of the clamp arms such that upward forces applied to the moveable arms will engage the hooking shaft against the clamp arms and urge the clamp arms into the latched position.

DESCRIPTION OF THE DRAWINGS

For a more complete understanding of the present invention and the advantages thereof, reference is now made to the following description taken in conjunction with the accompanying Drawings in which

FIGS. 1-4 are perspective views of an IC socket assembly showing a clamping mechanism for an IC socket disposed in various configurations for receiving and securing an IC component within the IC socket;

FIG. 5 is an exploded, perspective view of the IC socket, a printed circuit board to which the IC socket is secured, and a base plate for a fixture of the socket assembly;

FIG. 6 is a perspective view of a fixture which includes the clamping mechanism for the IC socket assembly;

FIG. 7 is an exploded perspective view of the fixture for the IC socket assembly;

FIG. 8 is a side elevation view of a clamp arm of the fixture shown disposed in a horizontal, clamping position;

FIG. 9 is a side elevation view of a moving arm of the fixture;

FIG. 10 is an exploded, perspective view of an IC socket assembly of an alternative embodiment of the present invention, having a clamping mechanism according to the present invention; and FIG. 11 is a perspective view of the IC socket assembly of FIG. 10 after assembly.

DETAILED DESCRIPTION OF THE INVENTION

Figure 1:
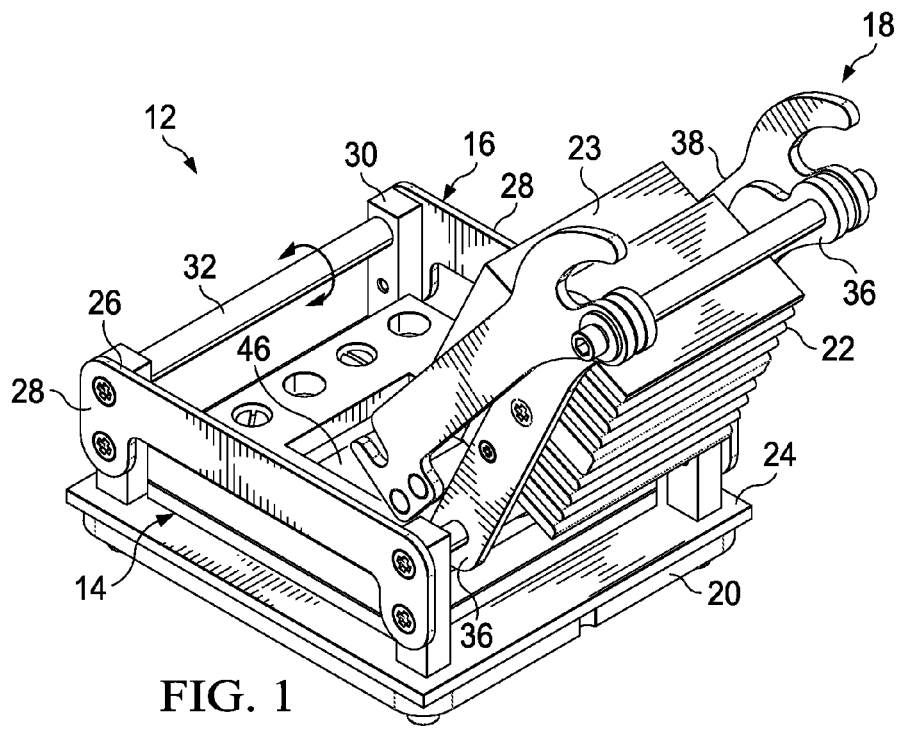
FIGS. 1 through 11 show various aspects for clamping mechanism for an IC socket made according to the present invention, as set forth below.
Figure 2:
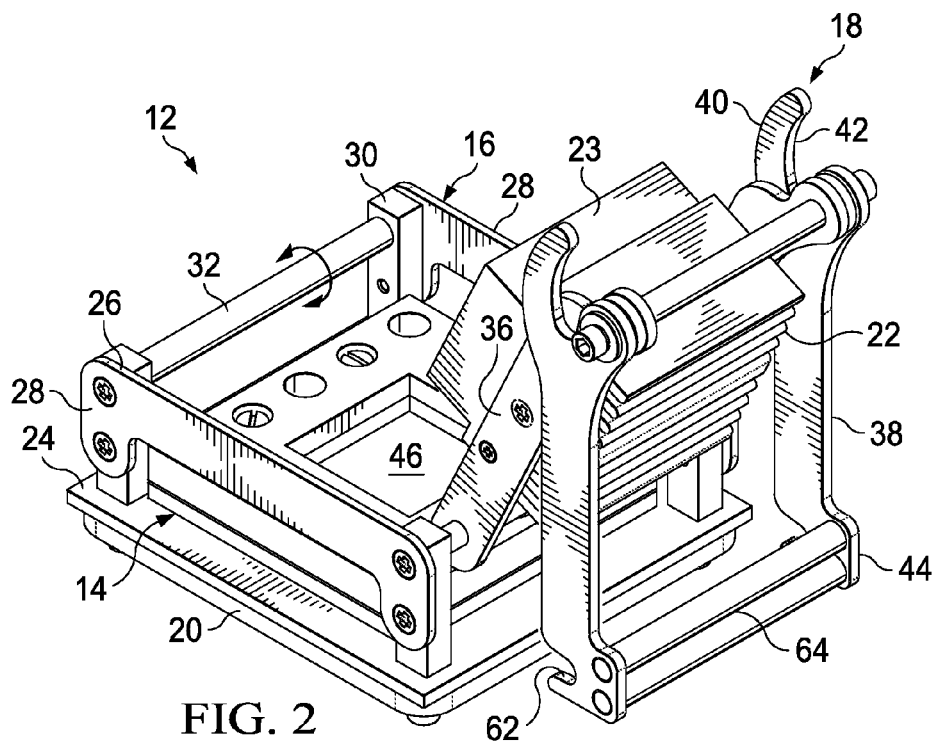
Figure 3:
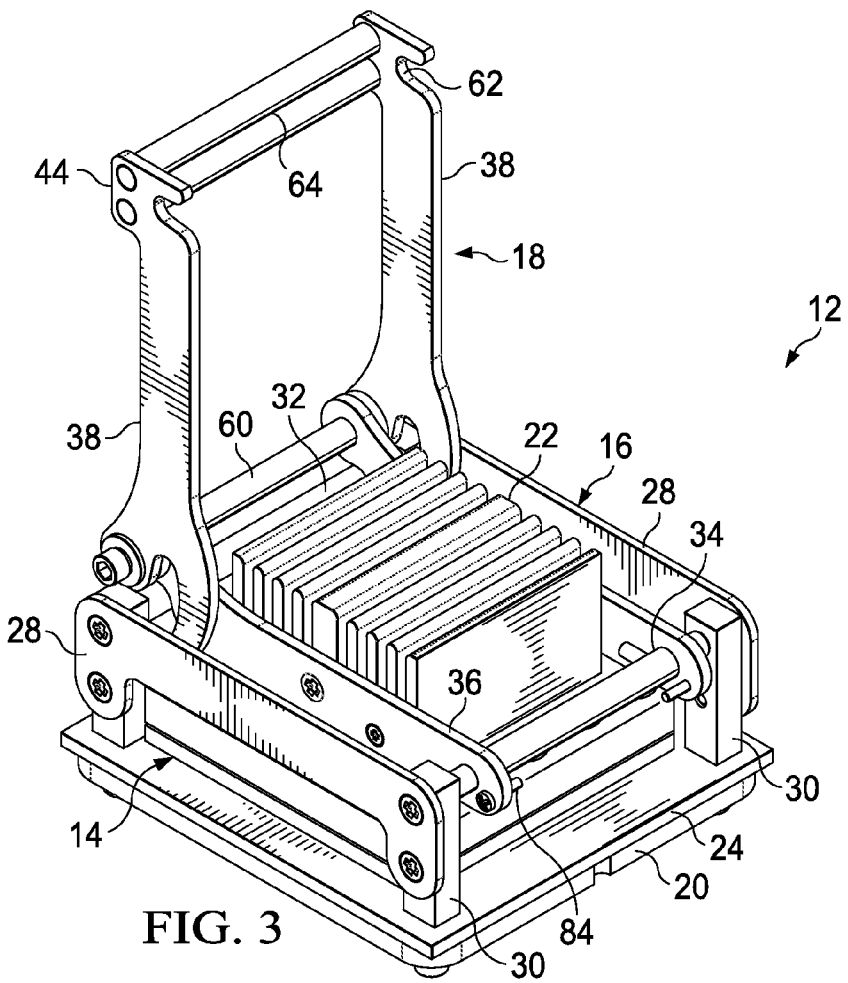
Figure 4:
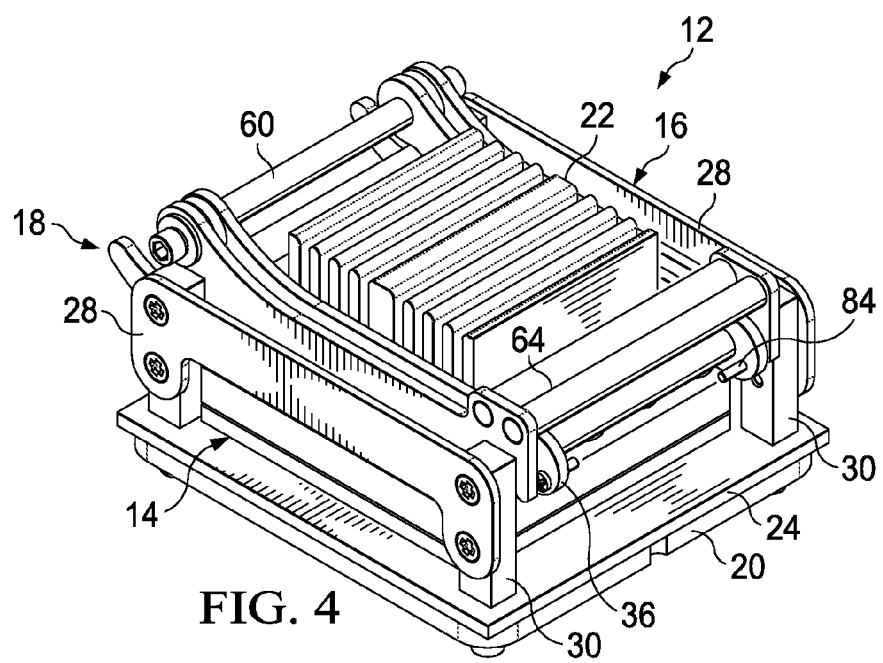

FIGS. 1-4 are perspective views of an IC socket assembly 12 having an IC socket 14 and a fixture 16 which includes a clamping mechanism 18, with the clamping mechanism 18 having moveable arms 36 and clamp arms 38 shown in various positions. The clamping mechanism 18 is shown in FIG. 1 in an open position for receiving an IC component (not shown) within the IC socket 14. FIG. 2 shows the clamping mechanism 18 in an open position prior to being moved downward to enclose the IC socket 14. FIG. 3 shows the clamping mechanism in a closed position atop the IC socket 14, with the moveable arms 36 moved from an open position to a closed position and the clamp arms 38 disposed in an unlatched position. FIG. 4 shows the clamping mechanism 18 in a locked position, pressing an end 23 of a heat sink 22 against the IC component (not shown) disposed within the IC socket 14 with the clamp arms 38 disposed in a latched position, or clamping position. The IC socket 14 has a component recess 46 formed into an upper side of the lift plate 52. The component recess 46 faces outwardly of the socket 14 with an outermost tapered guide portion and an innermost receiver portion for receiving IC components.

The fixture 16 has a frame 26 with a base plate 20, four vertically disposed posts 30 which extend upward from the base plate 20, and two fixed arms 28 mounted between respective ones of the posts 30. A printed circuit board ("PCB") 24 is mounted within the fixture 16 and on top of the base plate 20. The heat sink 22 is secured to the clamping mechanism 18 for pressing against the top of an IC component (not shown) secured within the IC socket 14. A hooking shaft 32 is preferably disposed in a fixed position extending between two of the posts 30, and is non-rotatably secured such that the hooking shaft 32 may not be rotated around a longitudinal axis of the hooking shaft 32. In other embodiments, the hooking shaft 32 may be rotatably disposed in a fixed position extending between two of the posts 30, and may be rotated around a longitudinal axis of the hooking shaft 32. A fixed shaft 34 is disposed opposite the hooking shaft 32 on the frame 26. Two moving arms 36 are pivotally secured to the fixed shaft 34. Two clamp arms 38 are pivotally secured to outward ends of moving arms 36. The clamp arms 38 have formed ends 40 which define hooks which face outward of the clamp arms 38 and provide two cam surfaces 42 that upwardly extend when the clamp arms 38 are disposed in horizontal positions. The two cam surfaces 42 of the clamp arms 38 engage with the hooking shaft 32, preferably with a frictional sliding engagement. In alternative embodiments in which the hooking shaft 32 rotates about a longitudinal axis thereof, as noted above, the cam surfaces 42 engaging the hooking shaft 32 with a cam-type action when securing the clamp arms 38 into the clamping position shown in FIG. 4 to require less force for securing the clamp arms 38 in the clamping position than if the hooking shaft 32 were not rotatably secured. The clamp arms 38 also have grip ends 44 with grip members 64 extending between ends disposed opposite the formed ends 40. Recesses 62 are formed in the lower sides of the clamp arms 38 for receiving the fixed shaft 34.

Figure 5:
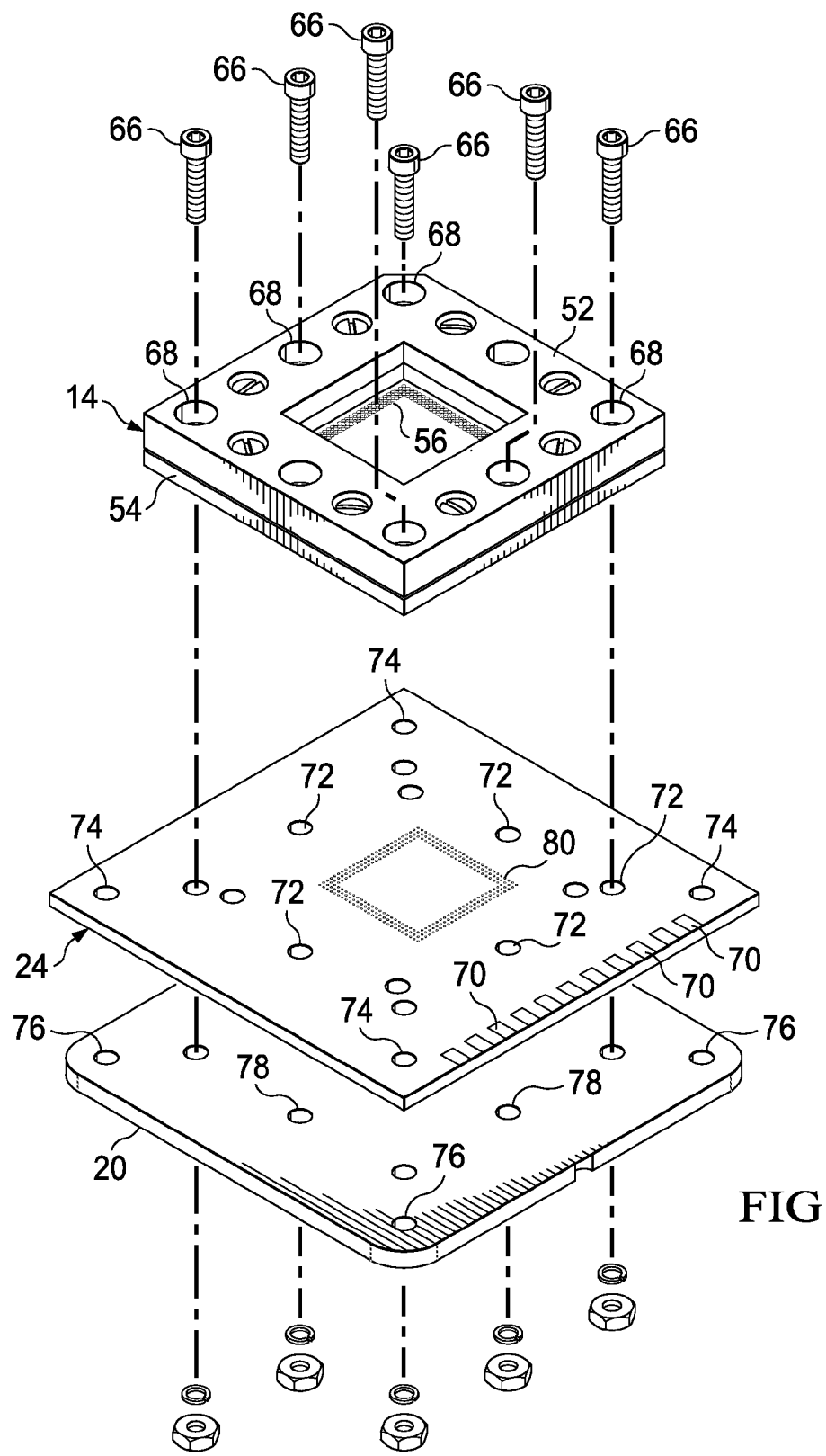
Figure 7:
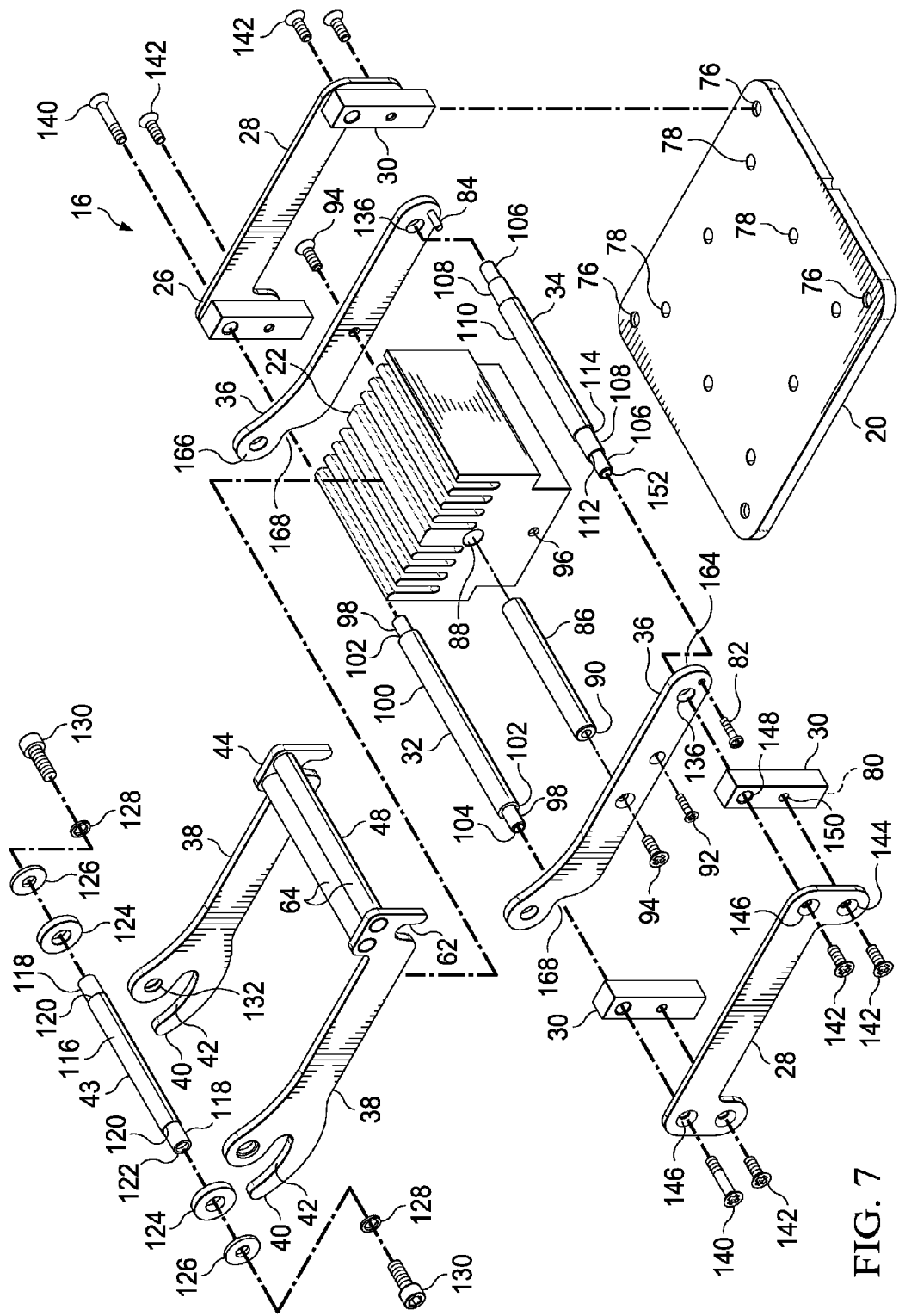

FIG. 5 is an exploded, perspective view of the IC socket 14 and the printed circuit board 24. The IC socket 14 includes a lift plate 52 and a contact plate 54. The lift plate 52 is secured above the contact plate 54, and is moveable relative to the contact plate 54 in conventional fashion for the IC socket 14. The contact plate 54 preferably has a plurality of contact pins 56 which extend for engaging against the contact pads of an IC component disposed within the IC socket 14. In conventional fashion the contact pins 56 will preferably have compliance which is typically provided by a spring means which pushes the contact pins against an IC component to assure acceptable electrical contact therewith, which results in pushing the IC component outward from within the IC socket 14. The IC socket 14 is preferably secured atop the circuit board 24 and the base plate 20 of the fixture 16 by means of the fasteners 66 with the accompanying nuts and washers. The fasteners 66 will extend through the apertures 68 in the socket 14, and the mounting holes 72 and 78 in respective ones of the printed circuit board 24 and the base plate 20. The printed circuit board 24 and the base plate 20 further have mounting holes 74 and 76, respectively, for mounting the frame 26 of the fixture 16 thereto as shown in FIG. 7. Preferably, the IC socket 14 may be secured to and then later removed from the printed circuit board 24 and the base plate 20 while the printed circuit board 24 and the base plate 20 remain secured to the fixture 16 with the clamping mechanism 18. The head sink 22 may also be separately removed from the clamping mechanism 18 should the head sink 22 require replacement to provide a lower portion 23 of the heat sink which is configured for being received within the component recess 46 of a corresponding IC socket 14 for pressing against an IC component disposed therein.

Figure 6:
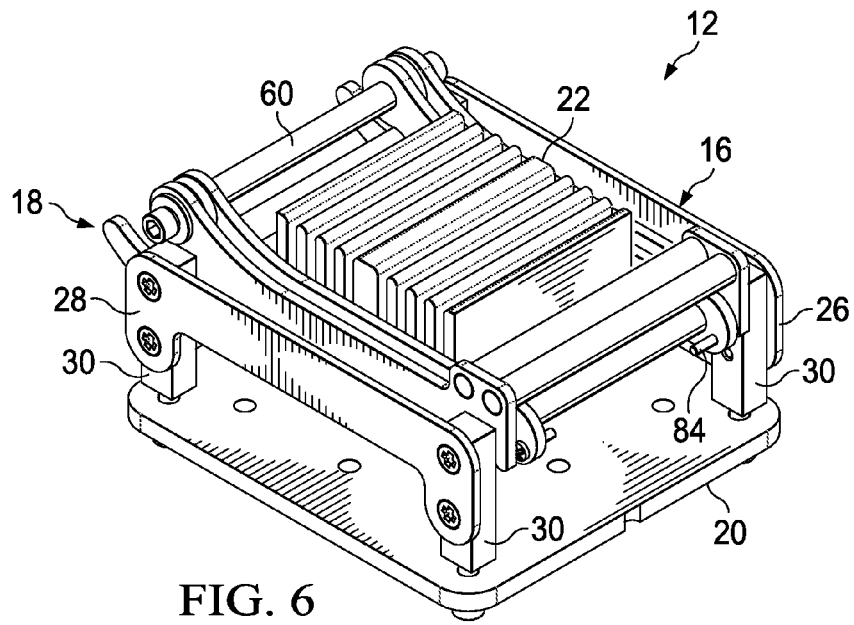

FIG. 6 is a perspective view and FIG. 7 is an exploded view of the fixture 16 for the IC socket assembly 12. The fixture 16 includes the clamping mechanism 18, the heat sink 22 and a frame 26. The two fixed arms 28 of the frame 26 are secured by four posts 30 to the base plate 20. The printed circuit board 24 (See FIGS. 1 and 5) is secured by the four posts 30 to a top side of the base plate 20. The posts 30 are secured to the base plate 20 by fasteners (not shown) which extend through apertures 76 in the base plate 20. The hooking shaft 32 is provided on one end of the frame 26, and the fixed shaft 34 is provided on an opposite end of the frame 26. The two moving arms 36 are pivotally secured to the fixed shaft 34 in spaced apart relation of a fixed spacing, with the moving arms 36 having pivot ends 164 which are pivotally secured to the fixed shaft 34 and free ends 166 which are spaced apart from the fixed shaft 34 and the pivot ends 164. The two clamp arms 38 are pivotally secured to respective ones of the free ends 166 of the moving arms 36. The formed ends 40 of the clamp arms 38 are pivotally secured to respective ones of the free ends 166 of the two moving arms 36. The clamp arms 38 have the grip ends 44 with two space bar grip members 64 extending between. The recesses 62 extend into the lower ends of the grip ends 44 for receiving the fixed shaft 34. The clamp arms 38 are spaced apart in a fixed relative relation by spacer bars 60 and 64. Two spacer bars 64 provide grip members extending between the grip ends 44 of the two spaced apart clamp arms 38. The recesses 62 are formed in the lower side of the clamp arms 38 for receiving and securing against the fixed shaft 34. The spacer bar 60 is disposed adjacent to the formed ends 40 of the two clamp arms 38. The spacer bar 60 has a main body portion 116 and two end portions 118. The two end portions 118 are of a smaller size than the main body portion 116 and define shoulders 120. Opposite ends 122 of the spacer bar 60 are threaded for receiving fasteners 130. Two lock washers 128, and washers 126 and 124 fit over opposite ends 118 of the spacer bar 60.

The fixed shaft 34 has two sets of oppositely disposed, spaced apart bearing portions 106 and 108. The bearing portions 106 fit within apertures 146 in the fixed arms 28 and apertures 148 in the posts 30, and have threaded ends 152 for receiving fasteners 142. The bearing portions 106 are received within the apertures 136 in the pivotally secured ends 164 of the moving arms 36. The bearing portions 108 are preferably adjacent to and of a larger size than respective ones of the bearing portions 106, defining shoulders 112 there-between. A central body portion 110 of the fixed shaft 34 is of a larger size than the bearing portion 108, defining shoulders 114 there-between. The hooking shaft 32 has a central body portion 100 and end portions 98. The end portions 98 fit within apertures 148 in the posts 30 and apertures 146 in one end of the fixed arms 28. The end portions 98 are of a smaller size than the central portion 100, defining shoulders 102 there-between. Opposite ends 98 of the hooking shaft 32 have threaded apertures 104 for receiving two of the fasteners 140. In alternative embodiments, as shown, the fasteners 140 are not fully secured in the apertures 146 and 148 so that the housing shaft 32 will rotate. A mounting pin 86 is provided for fitting through a mounting aperture 88 in the heat sink 22. The mounting pin 86 has threaded ends 90 on opposite sides of the pin 86 for receiving respective fasteners 94. The heat sink 22 also has apertures 96 for receiving a fastener 92, preventing the heat sink 22 from pivoting relative to the moving arms 36. Two opposed stop pins 84 are provided by shanks of the fasteners 82 for engaging the socket 14 and stopping the clamp arms 38 from rotating past a fixed, open position shown in FIGS. 1 and 2. Fixed arms 28 are also secured by fasteners 142 extending through apertures 144 in the fixed arms 28 and into the threaded apertures 150 in the posts 30.

Figure 8:
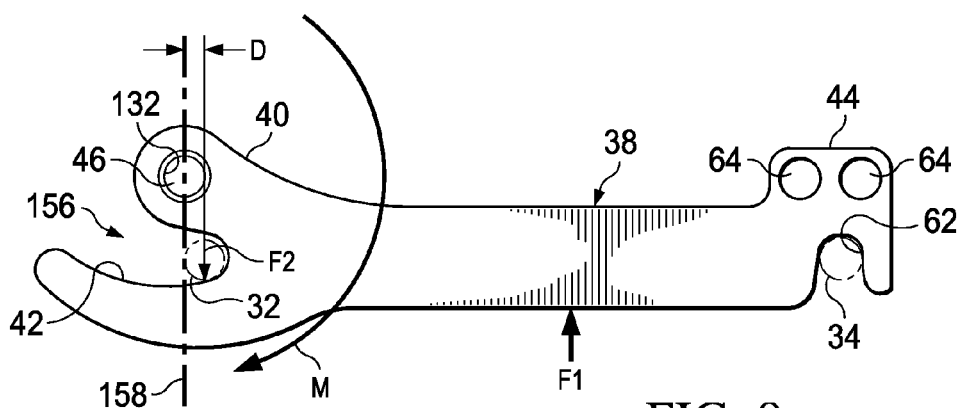

FIG. 8 is a side elevation view of one of the clamp arms 38 disposed in a horizontal, clamping position. When securing an IC component within the IC socket 14, the forces F1 will be applied upwards on the moveable arm 36 by the compliance of the electric contact pins 56 pushing upward on the bottom of an IC component. The cam surface 42 is formed such that it will engage the hooking shaft 32 an a downward force F2 will be applied to the cam surface 42 by the hooking shaft 32 in response to the upward force F1. The force F1 acts directly on the moveable arms 36 as shown in FIG. 8, and not directly on the clamp arms 38. The force F1 pushes upward on the moveable arms 36 to push the free ends 166 of the moveable arms 36 (shown in FIG. 9) upwards, with the free ends 166 pushing the formed hook ends 40 of the clamp arms 38 upward. According to the present invention, the cam surface 42 is formed such that the force F2 will be disposed to the right, as shown in FIG. 8, of the center line 158 of the shaft 46. This will result in the hooking shaft 32 acting as a fulcrum which is spaced apart from the centerline 158 by a spacing D and provides a moment arm for the force F2 to act across and urge the grip end 44 of the locking arm 38 downward and against the fixed shaft 34. This locks the clamp arm 38 in the clamping position and secures the clamping mechanism 18 atop the fixture 16 and the IC socket 14. The clamping mechanism 18 will be self-locking since the cam surface 42 of the formed end 40 of the clamp arm 38 is adapted to be formed with a shape such that the resultant force F1 will urge the locking arm 38 into the clamping position shown in FIG. 4, rather than being urged into the unlocked position shown in FIG. 3.

Figure 9:
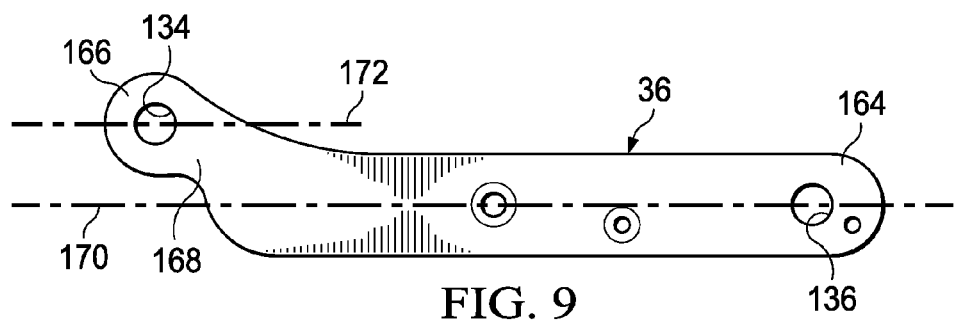

FIG. 9 is a side elevation view of one of the moving arms 36 of the fixture 16. The free end 166 of the moving arm 36 has and offset 168 so that the moving arms 36 may be moved to a downward position atop the hooking shaft 32, with the heat sink 22 engaging the top of an IC component located within the IC Socket 14. The offsets 168 are defined by a centerline 172 of the mounting apertures 134 being offset from a longitudinal axis 170 of the main body of the moving arm 36 extending through the pivotally secured end 164 of the arm 36, with the centerline 172 being defined as being parallel to the longitudinal axis 170. The centerline 172 and the centerline 158 of the holes 132 and 134 define clamp pivot points about which the clamp arms 38 rotate. Preferably, projections extend vertically from respective ones of the clamp pivot points, and are substantially perpendicular to the axis 170 extending between a moveable member pivot point defined by a centerline of the aperture 134 and a self-locking position defined by the position of the hooking shaft 32 within the opening 156 shown in FIG. 8.

Figure 10:
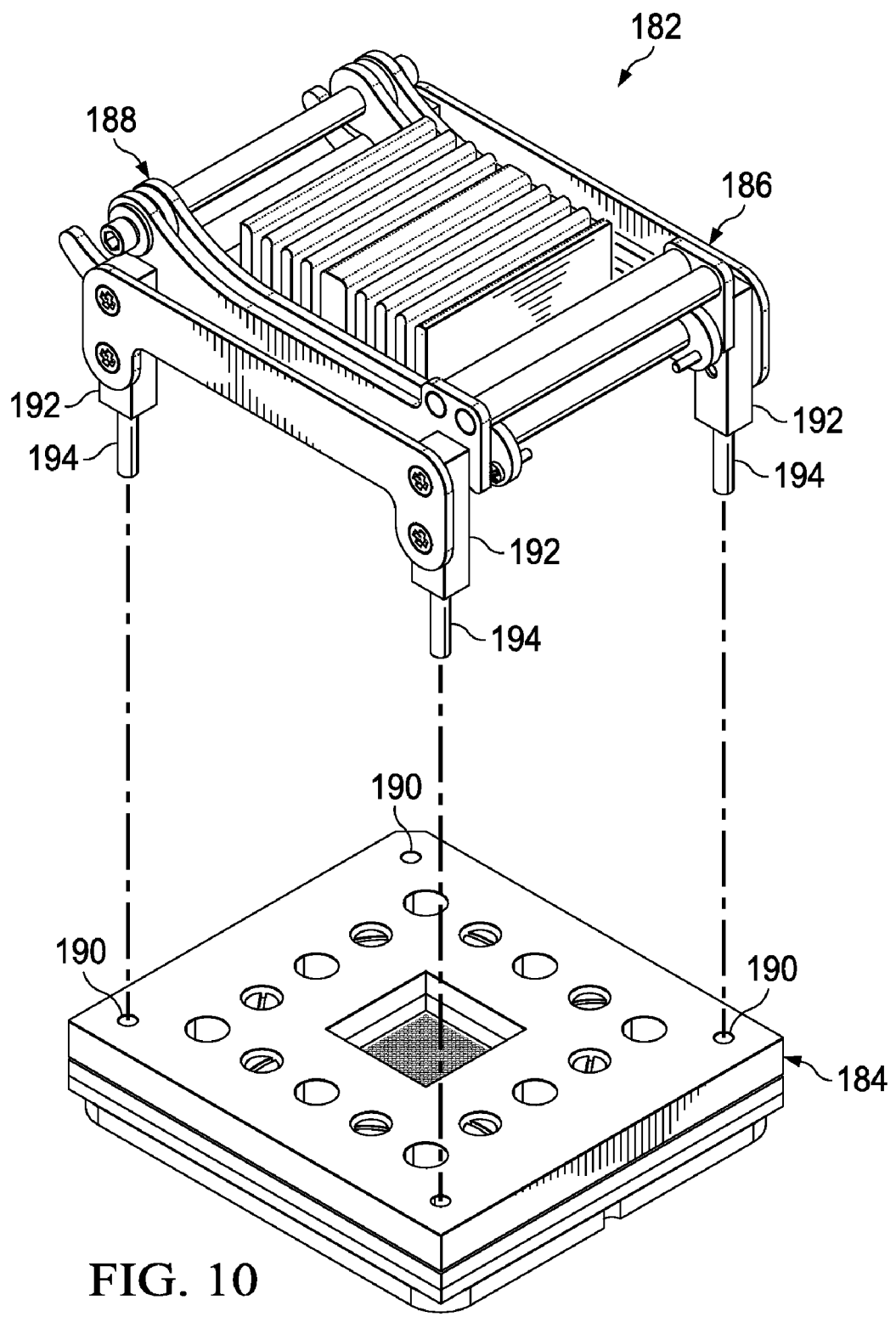
Figure 11:
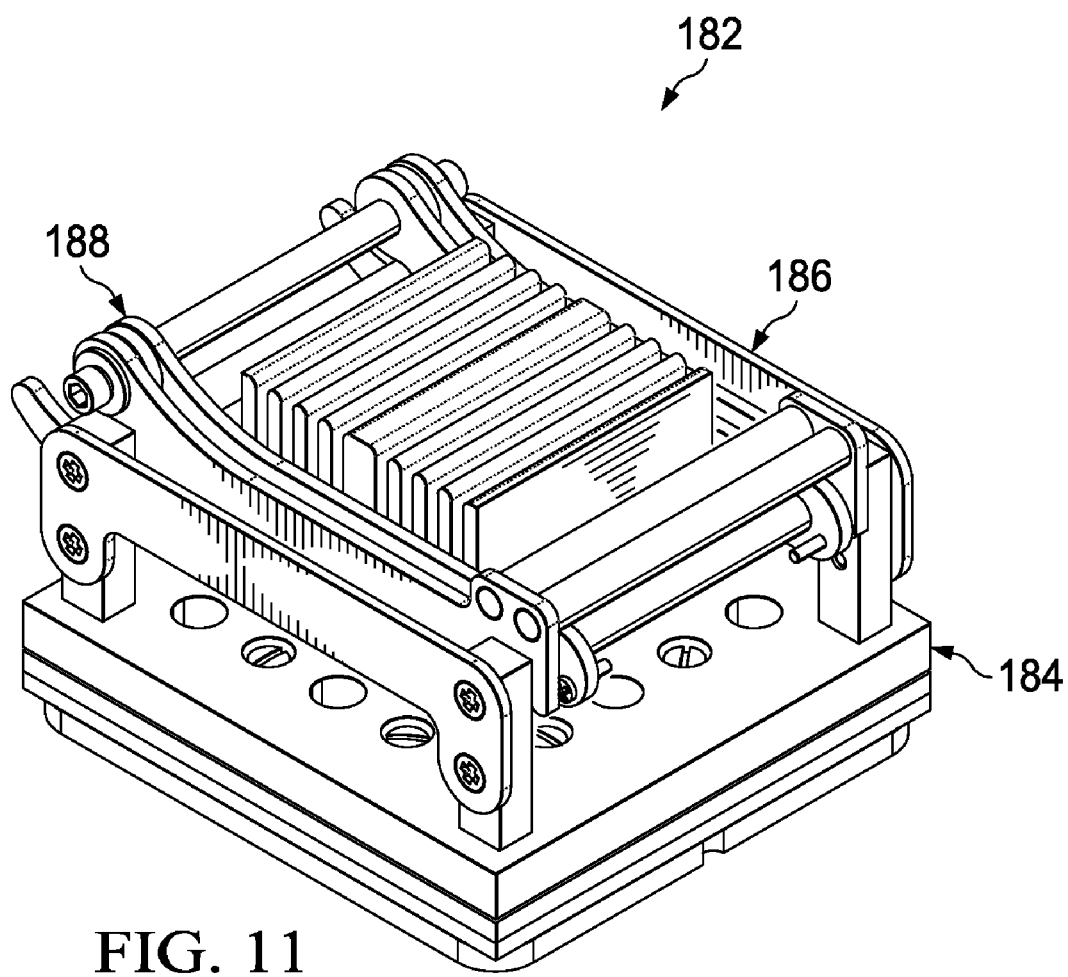

FIG. 10 is an exploded, perspective view and FIG. 11 is a perspective view of an IC socket assembly 182 of an alternative embodiment of the present invention. The IC socket assembly has an IC socket 184, a fixture 186, and a clamping mechanism 188. The clamping mechanism 188 is preferably identical to the clamping mechanism 18 described above. The fixture 186 has posts 30 with elongate mounting members 194 which extend downward beneath respective ones of the posts 30 for securing in mounting holes 190 formed directly into the IC socket 184. The mounting members 194 are preferably elongate cylindrical members which are integrally formed with the posts 192, such as by molding the posts 192 and the mounting members 194 as singular members formed of plastic or as a stamped metal part.

The present invention provides a self-locking clamping mechanism for a fixture for securing an IC component in a test socket. The clamping mechanism does not require a separate latch to secure the clamping mechanism in a closed position, but rather upward forces of the IC component pressing against clamping mechanism will push the clamping mechanism into a closed, latched position. The IC component is preferably pressed upward by the compliance of electric contact pins electrically connecting the IC component to the test socket.

Although the preferred embodiment has been described in detail, it should be understood that various changes, substitutions and alterations can be made therein without departing from the spirit and scope of the invention as defined by the appended claims.

What is claimed is:

1. A socket assembly for receiving an IC component and providing an electrical connection to the IC component, the socket assembly comprising:
   an IC socket;
   a fixed frame for securing said IC socket therein, said fixed frame having a first end and a second end with said IC socket disposed between said first and said second end of said fixed frame;
   two spaced apart moveable arms having pivot ends and free ends, said pivot ends pivotally secured to said second end of said fixed frame at moveable arm pivot points, and said free ends distally disposed from said first ends, wherein said moveable arms pivot from a open position, extending outward of said frame and said socket, to a closed position, extending across said frame to an opposite side of said socket from respective ones of said pivot ends of said moveable arms;
   two spaced apart clamp arms having formed ends and grip ends, said formed ends pivotally secured to said free ends of said moveable arms at clamp pivot points and said grip ends spaced apart from said clamp pivot points, said formed ends of said clamp arms each having an opening which extends from an outward edge of a respective one of said clamp arms to self-latching positions, wherein said clamp arms are moveable relative to said moveable arms from unlatched positions to latched positions, in which said self-latching positions of said openings are disposed between respective ones of said pivot ends of said moveable arms and projections from said clamp pivot points disposed at said free ends of said moveable arms, with said projections extend substantially perpendicular to respective axes of said movable arms which extend from said pivot ends to said self-latching positions; and wherein, when said moveable arms are disposed in said closed positions, said clamp arms are configured for disposing in said unlatched positions and receiving said first end of said fixed frame and then rotating about said clamp pivot points to said latched positions, which disposes said first end of said fixed frame in said self-locking positions, such that upward forces applied to said moveable arms engage said first end of said fixed frame against said clamp arms and urges said clamp arms into said latched positions.

2. The socket assembly according to claim 1, wherein said moveable arms are spaced apart on opposite sides of said socket, one of said moveable arms from an other of said moveable arms.

3. The socket assembly according to claim 2, wherein said clamp arms are spaced apart on opposite sides of said socket, a first of said clamp arms from a second of said clamp arms.

4. The socket assembly according to claim 1, wherein a heat sink is secured to said moveable arms, disposed between said moveable arms, and said heat sink has an end which is pressed downward into said socket when said moveable arms are disposed in said lowered positions.

5. The socket assembly according to claim 1, wherein said moveable arms extend in parallel and said clamp arms are parallel to said moveable arms.

6. The socket assembly according to claim 1, wherein said moveable arms and said clamp arms are disposed perpendicular to said first end of said fixed shaft.

7. The socket assembly according to claim 1, wherein said grip ends of said clamp arms engage and press against said second end of said fixed frame when the upward force is applied to said moveable arms.

8. A socket assembly for receiving an IC component and providing an electrical connection to the IC component, the socket assembly comprising:
   an IC socket;
   a fixture having a fixed frame for securing said IC socket therein, a first end of said fixed frame having a hooking shaft and a second end of said fixed frame having a fixed shaft, with said fixed shaft being spaced apart from and disposed in fixed relation to said hooking shaft with said IC socket disposed there-between;
   two spaced apart moveable arms having pivot ends pivotally secured to said fixed shaft at said second end of said fixed frame at moveable arm pivot points, and free ends distally disposed from said pivot ends, wherein said moveable arms pivot from a open position, extending outward of said fixed frame and said socket, to a closed position, extending across said frame to an opposite side of said socket from respective ones of said pivot ends of said moveable arms;
   two spaced apart clamp arms having formed ends pivotally secured to said free ends of said moveable arms at clamp pivot points and grip ends spaced apart from said latch pivot points, said formed ends of said clamp arms each having an opening which extends from an outward edge of a respective one of said clamp arms to self-latching positions, wherein said clamp arms are moveable relative to said moveable arms from unlatched positions to latched positions, in which said self-latching positions of said openings are disposed between respective ones of said pivot ends of said moveable arms and projections from said clamp pivot points disposed at said free ends of said moveable arms, with said projections extend substantially perpendicular to respective axes of said movable arms which extend from said pivot ends to said self-latching positions; and wherein, when said moveable arms are disposed in said closed positions, said clamp arms are configured for disposing in said unlatched positions and receiving said hooking shaft in said openings and then rotating about said clamp pivot points to said latched positions, which disposes said hooking shaft in said self-locking positions in said openings, such that upward forces applied to said moveable arms engage said hooking shaft against said clamp arms and urges said clamp arms into said latched positions.

9. The socket assembly according to claim 8, wherein said moveable arms are spaced apart on opposite sides of said socket, one of said moveable arms from an other of said moveable arms.

10. The socket assembly according to claim 9, wherein said clamp arms are spaced apart on opposite sides of said socket, a first of said clamp arms from s second of said clamp arms.

11. The socket assembly according to claim 10, wherein a heat sink is secured to said moveable arms, disposed between said moveable arms, and said heat sink has an end which is pressed downward into said socket when said moveable arms are disposed in said lowered positions.

12. The socket assembly according to claim 11, wherein said moveable arms extend in parallel and said clamp arms are parallel to said moveable arms.

13. The socket assembly according to claim 12, wherein said moveable arms and said clamp arms are disposed perpendicular to said hooking shaft and said fixed shaft.

14. The socket assembly according to claim 13, wherein said grip ends of said clamp arms engage and press against said fixed shaft when the upward force is applied to said moveable arms.

15. A socket assembly for receiving an IC component and providing an electrical connection to the IC component, the socket assembly comprising:

an IC socket;

a fixture having a fixed frame for securing said IC socket therein, a first end of said fixed frame having a hooking shaft and a second end of said fixed frame having a fixed shaft, wherein said fixed shaft is spaced apart from and disposed in fixed relation to said hooking shaft, and said IC socket disposed between said hooking shaft and said fixed shaft;

two moveable arms spaced apart to extend on opposite sides of said socket, with said moveable arms having pivot ends pivotally secured to said fixed shaft at said second end of said fixed frame at moveable arm pivot points, and free ends distally disposed from said pivot ends, wherein said moveable arms pivot from an open position, extending outward of said fixed frame and said socket, to a closed position, extending across said frame to an opposite side of said socket from respective ones of said pivot ends of said moveable arms;

two clamp arms spaced apart on opposite sides of said socket, said clamp arms having hook ends pivotally secured to said free ends of said moveable arms at clamp pivot points and grip ends spaced apart from said clamp pivot points, said hook ends of said clamp arms each having an opening which extends from an outward edge of a respective one of said clamp arms to self-latching positions, wherein said clamp arms are moveable relative to said moveable arms from unlatched positions to latched positions, in which said self-latching positions of said openings are disposed between respective ones of said pivot ends of said moveable arms and projections from said clamp pivot points disposed at said free ends of said moveable arms, with said projections extend substantially perpendicular to respective axes of said movable arms which extend from said pivot ends to said self-latching positions;

wherein, when said moveable arms are disposed in said closed positions, said clamp arms are configured for disposing in said unlatched positions and receiving said hooking shaft in said openings and then rotating about said clamp pivot points to said latched positions, which disposes said hooking shaft in said self-locking positions in said openings, such that upward forces applied to said moveable arms engage said hooking shaft against said clamp arms and urges said clamp arms into said latched positions; and a heat sink is secured to said moveable arms, disposed between said moveable arms, and said heat sink has an end which is pressed downward into said socket when said moveable arms are disposed in said lowered positions.

16. The socket assembly according to claim 15 wherein said moveable arms extend in parallel and said clamp arms are parallel to said moveable arms.

17. The socket assembly according to claim 15 wherein said moveable arms and said clamp arms are disposed perpendicular to said hooking shaft and said fixed shaft.

18. The socket assembly according to claim 17 wherein said grip ends of said clamp arms engage and press against said fixed shaft when the upward force is applied to said moveable arms.

* * * * *